United States Patent [19]
Plavidal et al.

[11] Patent Number: 5,718,795
[45] Date of Patent: Feb. 17, 1998

[54] RADIAL MAGNETIC FIELD ENHANCEMENT FOR PLASMA PROCESSING

[75] Inventors: Richard W. Plavidal, Los Gatos; Shaoher X. Pan, San Jose, both of Calif.

[73] Assignee: Applied Materials, Inc., Santa Clara, Calif.

[21] Appl. No.: 517,281

[22] Filed: Aug. 21, 1995

[51] Int. Cl.$^6$ ............................. H01L 21/302; C23F 1/04
[52] U.S. Cl. .................. 156/345; 315/111.41; 118/723 E; 216/71
[58] Field of Search .................. 156/345, 643.1; 216/71; 118/723 E; 315/111.41; 204/298.37, 298.16

[56] References Cited

U.S. PATENT DOCUMENTS

| | | | |
|---|---|---|---|
| 4,826,585 | 5/1989 | Davis | 204/298 |
| 5,081,398 | 1/1992 | Asmussen et al. | 315/111.41 |
| 5,430,355 | 7/1995 | Paranjpe | 315/111.51 |

FOREIGN PATENT DOCUMENTS

| | | |
|---|---|---|
| 62-111430 | 5/1987 | Japan. |
| 62-286227 | 12/1987 | Japan. |
| 5-0547715 | 2/1993 | Japan. |

*Primary Examiner*—R. Bruce Breneman
*Assistant Examiner*—George Goudreau
*Attorney, Agent, or Firm*—Michaelson & Wallace

[57] ABSTRACT

The present invention is embodied in a plasma reactor for processing a workpiece such as a semiconductor wafer having an axis of symmetry, the reactor including a reactor chamber with a ceiling having an upwardly extending annular pocket bounded by a pair of circumferential side walls, a pedestal for supporting the workpiece within the chamber under the ceiling, a processing gas supply inlet into the chamber, an RF plasma power source coupled to the pedestal, and a magnetic field source near the ceiling providing a radially symmetrical magnetic field having a magnetic pole of one type facing said inner circumferential wall and a magnetic pole of the opposite type facing said outer circumferential wall so as to apply a magnetic field generally straight across said annular pocket. The straight magnetic field lines of the radially symmetrical magnetic field are generally confined to the annular pocket, penetrating into the chamber to a very shallow depth, if at all, and the height of the ceiling above the workpiece exceeds the magnetic field penetration depth.

24 Claims, 6 Drawing Sheets

RADIAL MAGNETIC FIELD ENHANCEMENT FOR PLASMA PROCESSING

BACKGROUND OF THE INVENTION

1. Technical Field

The invention concerns a magnetically enhanced reactive ion etch (MERIE) plasma reactor and specifically an MERIE plasma reactor having a shallow magnetic field with minimal strength at the wafer surface and with radial symmetry across the wafer surface.

2. Background Art

A plasma reactor for processing a substrate such as a semiconductor wafer typically includes a reactor chamber containing a processing gas and a pedestal supporting the wafer within the chamber. In order to ignite a plasma by ionizing the processing gas, a radio frequency (RF) power source is applied to the wafer pedestal. The RF power coupled into the chamber ignites and maintains a plasma while also attracting ions toward the wafer pedestal. The RF power excites the electrons in the chamber by reason of their high charge-to-mass ratio, and the excited electrons collide with neutral species (e.g., molecules and radicals) of the processing gas to create ions. The ions react with the wafer on the pedestal to etch certain thin films thereon, for example, while some ion-wafer collisions cause ion bombardment or sputtering damage on the wafer surface, depending upon the energy with which the ions collide with the wafer surface. The ion energy is determined by the RF power applied to the wafer pedestal.

A fundamental limitation of such a plasma reactor is that there is a tradeoff between the plasma density and the ion bombardment damage on the wafer. This is because in order to increase the plasma ion density in the chamber, the RF power applied to the wafer pedestal must be increased, which in turn increases the ion energy at the wafer surface, thereby increasing ion bombardment damage. This tradeoff limits the performance of a plasma reactor. In a plasma reactor which performs a plasma etch process, the processing gas is an etchant such as HF, $CF_3$ or $CF_6$, for example, and the etch rate is determined in large part by the density of fluorine-containing ions, which in turn is limited by constraining the RF power applied to the wafer pedestal to avoid excessive ion bombardment damage to the wafer.

Another problem is that increasing the RF power (in order to increase plasma ion density) increases sputtering of the chamber ceiling and walls. Such increased sputtering of the chamber ceiling and walls increases the amount of sputtered material introduced into the chamber and onto the wafer which can interfere with the etch process. For example, if the ceiling is quartz and the process being performed on the wafer is a silicon dioxide etch process, then some fraction of the quartz sputtered from the ceiling deposits onto the wafer surface and competes with the etch process, thereby reducing the etch rate. (Sputtering of the ceiling also consumes an expensive component of the chamber). As another example, if the processing gas includes $CF_3$, $CHF_3$, $CF_6$, $Cl_2$, or HBr the polymer material formed therefrom on the interior ceiling surface may be sputtered onto the wafer surface, thereby contaminating microelectronic devices on the wafer surface.

One technique for enhancing the plasma ion density in a plasma etch process without necessarily increasing ion bombardment damage on the wafer and sputtering is magnetically enhanced reactive ion etching (MERIE). In this technique, the plasma reactor described above is improved by the addition of plural (typically four) ring magnets placed symmetrically around the sides of the chamber. Typically, the diameter of each magnet is on the order of the height of the reactor chamber. The MERIE magnetic field produced within the chamber by these magnets causes the electrons—due to their large charge-to-mass ratio—to assume a complex circular and spiral motion in addition to their vertical linear motion induced by the RF power applied to the wafer pedestal. The circular and spiral motion of the electrons induced by the MERIE magnetic field increases the ionizing collisions by the electrons, thereby increasing the plasma ion density. The result is that ion density—and therefore the etch rate—is increased. However, there is no proportionate increase in ion bombardment damage on the wafer because the RF power applied to the wafer pedestal is not increased. Moreover, any spiral motion of the ions induced by the MERIE magnetic field does not directly increase the ion-wafer collision energy.

One problem with such MERIE techniques is that the magnetic field within the chamber is necessarily discontinuous because it is produced by (four) discrete adjacent magnets. The plasma ions tend to be-focused into "corner" areas between the magnets, thus producing non-uniform etch rates across the wafer surface, a significant disadvantage. Further, it has been generally found that the plasma ions tend to migrate toward the wafer edge and away from the wafer center, thus contributing to the non-uniformity in etch rate across the wafer surface. Often, the etch rate tends to vary greatly along a given radius of the wafer, the etch rate on the wafer increasing with the radius.

This problem of non-uniform etch rate has been ameliorated in MERIE plasma reactors by rotating the magnetic field produced by the plural (four) magnets placed around the side of the chamber. Typically, such rotation is achieved by employing electromagnets around the sides of the chamber and applying RF signals in the magnet windings, a sine wave RF signal being applied to the windings of alternate ones of the magnets and a cosine wave RF signal of the same frequency being applied to the windings of the remaining ones of the magnets, for example. The idea is that the rotation of the magnetic field within the chamber across the wafer surface disperses corner effects and reduces ion focusing and thereby reduces plasma ion non-uniformity across the wafer surface, thus providing a partial solution to the problem.

However, this solution raises two additional problems. First, the rotation of the MERIE magnetic field must be limited to below ten Hertz to avoid excessive heating of the chamber side walls, thus limiting its efficacy. Second, the rotation of the MERIE magnetic field and hence the rotation of plasma ball around the wafer surface produces charge damage in the microelectronic semiconductor structures already fabricated on the wafer surface. For example, thin gate oxide layers are particularly susceptible to breakdown. Such breakdown occurs because the changing, magnetic field and plasma density across the wafer surface produces relatively large forces on charges already accumulated in such microelectronic structures during plasma processing in the reactor.

Even without rotation of the magnetic field there is a risk of charge damage to microelectronic structures simply because the magnetic field itself is non-uniform across the wafer surface, leading to non-uniform plasma ion and electron density across the wafer surface. Such non-uniform plasma ion and electron distribution across the wafer surface leads to non-uniform charge accumulation and electrical potential differences across the wafer surface. Such potential differences can be sufficient to break down the more susceptible features (e.g., thin gate oxide layers) of the microelectronic structures on the wafer. Accordingly, the inventors herein recognize that the presence of the MERIE magnetic field at the wafer surface is itself a problem which limits the performance of MERIE reactors.

Therefore, it is an object of the present invention to provide an MERIE magnetic field which is of a minimum strength at the wafer surface and of maximum strength elsewhere in the reactor chamber.

It is another object of the present invention to provide an MERIE magnetic field which has improved uniformity across the wafer surface.

It is a related object of the present invention to provide an MERIE magnetic field which has radial symmetry across the wafer surface.

SUMMARY OF THE DISCLOSURE

The present invention is embodied in a plasma reactor for processing a workpiece such as a semiconductor wafer having an axis of symmetry, the reactor including a reactor chamber with a ceiling, a pedestal for supporting the workpiece within the chamber under the ceiling, a processing gas supply inlet into the chamber, an RF plasma power source coupled to the pedestal, and a magnetic field source near the ceiling providing a radially symmetrical magnetic field relative to the axis of symmetry within a portion of the chamber near the ceiling. The reactor chamber ceiling has an annular pocket extending upwardly therefrom. The magnetic field source imposes a magnetic field across the annular pocket. Preferably this is accomplished by providing plural magnetic poles of one type (e.g., north poles) around the inner circumference of the annular pocket and plural magnetic poles of the opposite type (e.g., south poles) around the outer circumference of the annular pocket. In a preferred embodiment, the annular pocket has a conical cross section so that the center is higher while the periphery is lower (and therefore closer to the workpiece) in order to compensate for non-uniformities inherent in the magnetic field of the source. The radially symmetrical magnetic field effectively penetrates from the ceiling into the chamber to a shallow depth, and the height of the ceiling above the workpiece exceeding the penetration depth of the magnetic field.

In a preferred embodiment, the magnetic field source is a magnetic yoke above the ceiling having evenly-spaced radial spokes symmetrically placed relative to the annular pocket in the ceiling. The yoke includes inner and outer ring surfaces facing the inner and outer circumferences, respectively, of the annular pocket. Each spoke is coupled at its respective ends with the inner and outer ring surfaces of the yoke. Preferably, the magnetic yoke including the radial spokes and the inner and outer ring surfaces are integrally formed together. Preferably, the magnetic field source is an electromagnet, with coil windings provided around each radial spoke.

In accordance with a preferred embodiment, the annular pocket has a conical cross section, the center of the pocket extending upwardly toward an apex at a tilt angle selected to optimize plasma ion density distribution uniformity.

The center of the yoke includes a processing gas shower head connected to the processing gas inlet.

DETAILED DESCRIPTION OF THE PREFERRED EMBODIMENTS

Figure 1A:
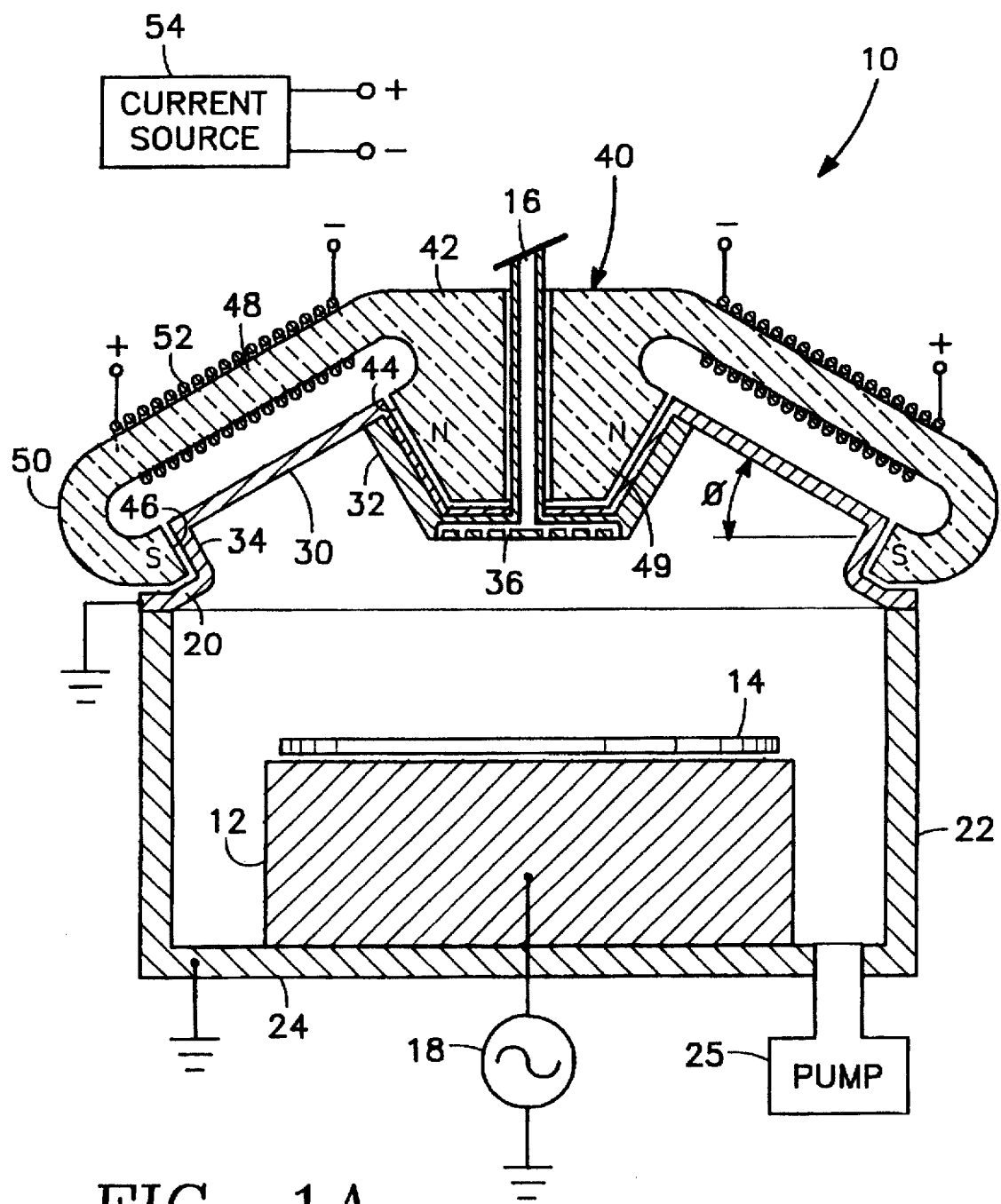
FIG. 1A is a side view of a plasma reactor of a first embodiment of the invention employing an electromagnet including a yoke with multiple radial spokes with coil windings about each spoke.
Figure 1B:
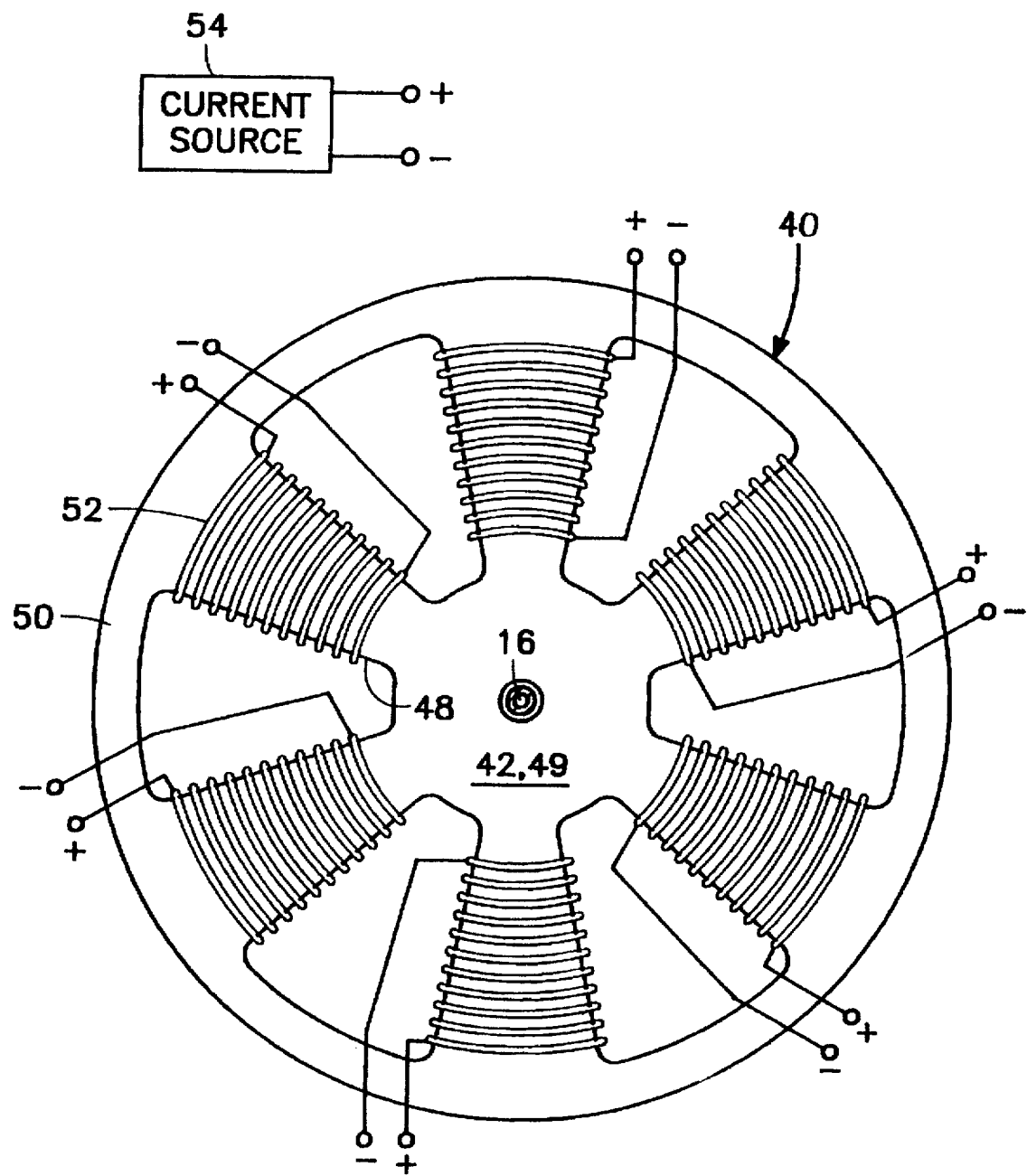
FIG. 1B is a top view corresponding to FIG. 1A.

Referring to FIGS. 1A and 1B, an MERIE plasma reactor includes a chamber 10 having a pedestal 12 for supporting a workpiece 14 such as a semiconductor wafer within the chamber. Gas inlets 16 supply a processing gas (such as an etchant gas) into the interior of the chamber 10. An RF power source 18 connected between the pedestal 12 and ground provides sufficient power to ionize the processing gas within the chamber to provide and maintain a plasma therein. The power source 18 includes conventional impedance matching circuitry for maintaining an impedance match between output impedance of the power source 18 and the load impedance presented by the plasma in the chamber. The chamber 10 is enclosed by a round ceiling 20 made of aluminum, silicon or quartz, a cylindrical aluminum side wall 22 and a floor 24. Typically, the ceiling 20 and side wall 22 of the chamber 10 are grounded. A vacuum pump 25 controls the pressure inside the chamber 10.

In accordance with the invention, the ceiling 20 has an annular pocket 30 extending upwardly. The annular pocket 30 is flanked by an inner circumferential wall 32 and outer cicumferential wall 34. The processing gas and plasma fills the interior of the chamber 10 including the annular pocket 30. For this purpose, the processing gas inlet 16 may terminate at a gas distribution shower head 36 located at the center of the ceiling 20. The shower head 36 may be formed of teflon, for example.

A magnetic field source 40 provided externally of the chamber 10 over the ceiling 20 includes a magnetic yoke 42 having inner and outer circumferential surfaces 44, 46 facing the external faces of the inner and outer circumferential walls 32, 34, respectively, of the annular pocket 30. The yoke 42 further includes plural radial spokes 48, the two ends of each spoke 48 being connected between the inner and outer circumferential surfaces 44, 46. The inner circumferential surface of the magnetic yoke 42 preferably defines a hub 49 from which the radial spokes 48 emanate. The outer circumferential surface 46 defines a wheel 50 in which the radial spokes 48 terminate. In the preferred embodiment, the yoke 42 has no permanent magnetization. Instead, each spoke 48 has an electromagnetic winding 52 of about thirty turns evenly spaced along the spoke 48. This provides a magnetic field having one pole (e.g., the north pole) at the inner circumferential surface 44 of the yoke 42 and the opposite pole (e.g., the south pole) at the outer circumferential surface 46. The windings 52 are single conductors wound about the radial axis of the respective spokes 48. A current source 54 provides the electric current necessary to generate a 500 Gauss magnetic field below the ceiling 20. The current source 54 may provide an A.C., D.C. or RF current.

The top surface of the annular pocket 30 may be tilted upwardly toward the center by a tilt angle Θ to provide a conical cross-section, and the radial spokes 48 are similarly tilted, as illustrated in FIG. 1A. The purpose of the tilt is to compensate for an inherent nonuniformity in the magnetic field produced by the source 40, the field tending to be stronger in the center and weaker near the periphery of the ceiling. Preferably, the tilt angle Θ of the annular pocket 30 is in the range of 30 degrees to 45 degrees. The magnetic field lines extend at the tilt angle Θ straight across the annular pocket 40 between the inner and outer walls 32, 34. As a result, little or no magnetic field reaches the workpiece below, a significant advantage.

As electrons of the plasma inside the interior annular pocket 30 are accelerated in a generally vertical direction (between the pedestal 12 and ceiling 20) by the RF power applied to the wafer pedestal 12, the MERIE magnetic field extending horizontally across each interior annular pocket 30 causes the electrons to execute a spiral motion about a generally vertical axis. This additional (spiral) motion of the electrons produces a greater number of ionizing collisions with neutral particles (molecules, radicals) of the processing gas, thereby enhancing plasma ion production within the interior annular pocket 30 inside the chamber 10. This enhances the plasma ion density throughout the chamber 10 without any increase in the power of the RF source 18 and therefore without a proportional increase in ion bombardment damage on the wafer.

If the processing gas inside the chamber 10 includes an etchant such as fluorine, this ionization process produces fluorine ions and radicals which react with and etch certain materials on the wafer surface (such as silicon bulk, polysilicon layers or silicon dioxide layers, for example). Thus, in an etch process, the greater plasma ion density provides a greater etch rate without proportionately greater ion bombardment damage on the wafer.

One advantage the MERIE reactor of FIGS. 1A and 1B provides over conventional MERIE reactors is that the magnetic field has far greater uniformity and is in fact radially symmetrical. This is due to the radial symmetry of the magnetic yoke 42 including the radial spokes 48. As a result, there are virtually no corners in the magnetic field to focus electrons or ions near the wafer surface, so that plasma ion density is more uniform. This greater uniformity of the plasma ion density provides far greater uniformity in etch rate across the wafer surface, a significant advantage. Another advantage of such increased uniformity is that it reduces electric charge accumulation and charge damage or breakdown damage (in microelectronic structures on the wafer) of the type caused in conventional MERIE plasma reactors by corners in the magnetic field or focusing of ions or electrons.

Another advantage of the MERIE reactor of FIGS. 1A and 1B is that the MERIE magnetic field is generally restricted to the interior annular channels 30 and falls off so rapidly away from the ceiling 20 (approximately as the square of the distance) that there is little or no magnetic field at the wafer. Therefore, whatever non-uniformities that may exist in the magnetic field have little or no direct effect at the wafer surface. This reduces any magnetic field corner effects and charge focusing at the wafer surface, which in turn reduces charge accumulation and charge damage in microelectronic structures at the wafer surface.

For a given plasma ion density, the RF power applied to the wafer pedestal 12 may be decreased with the introduction of the magnetic field source 40, since the MERIE magnetic field produced by the magnetic field source enhances the plasma ion density. As a result, there is less sputtering of the chamber ceiling and walls. One advantage is that the reduction in sputtering of the chamber ceiling and walls reduces the amount of sputtered material introduced into the chamber 10 and onto the wafer which can interfere with the etch process. For example, if the ceiling is quartz and the process being performed on the wafer is a silicon dioxide etch process, then some fraction of the quartz sputtered from the ceiling deposits onto the wafer surface and competes with the etch process, thereby reducing the etch rate. (Sputtering of the ceiling 20 also consumes an expensive component of the chamber 10). As another example, if the processing gas includes $CF_3$ or $CF_6$, the polymer material formed therefrom on the interior ceiling surface may be sputtered onto the wafer surface, thereby contaminating microelectronic devices on the wafer surface. These problems are solved in the present invention with the reduction in sputtering.

A further advantage of the embodiment of FIGS. 1A and 1B is that the chamber operating pressure has a much wider range (1–350 mTorr) than inductively coupled plasma reactors (whose pressure range is generally restricted to 5–20 mTorr).

In accordance with one implementation of the embodiment of FIGS. 1A and 1B for processing an 8-inch (20 cm) diameter semiconductor wafer, the wafer pedestal 12 has a diameter of about 8 inches (20 cm), the chamber has a diameter of about 12 inches (30 cm) and the outside diameter of each radial spoke 48 is about 1 inch (2.5 cm). The height of the annular pocket 30 is on the order of about 1 inch (2.5 cm) and the width of the annular channel 30 is on the order of about 3 inches (7.5 cm). The windings around each radial spoke comprise thirty turns and the applied electrical current from the current source 54 is such as to generate a magnetic field strength on the order of about 500 Gauss immediately below the ceiling 20. In this implementation, the RF power applied to the wafer pedestal 12 is about 500–1000 Watts at 13.56 MHz and the processing gas ($Cl_2$, HBr, or $CF_3$) flow rate was 20–100 SCCM at a chamber pressure of about 20–200 mTorr.

Figure 2A:
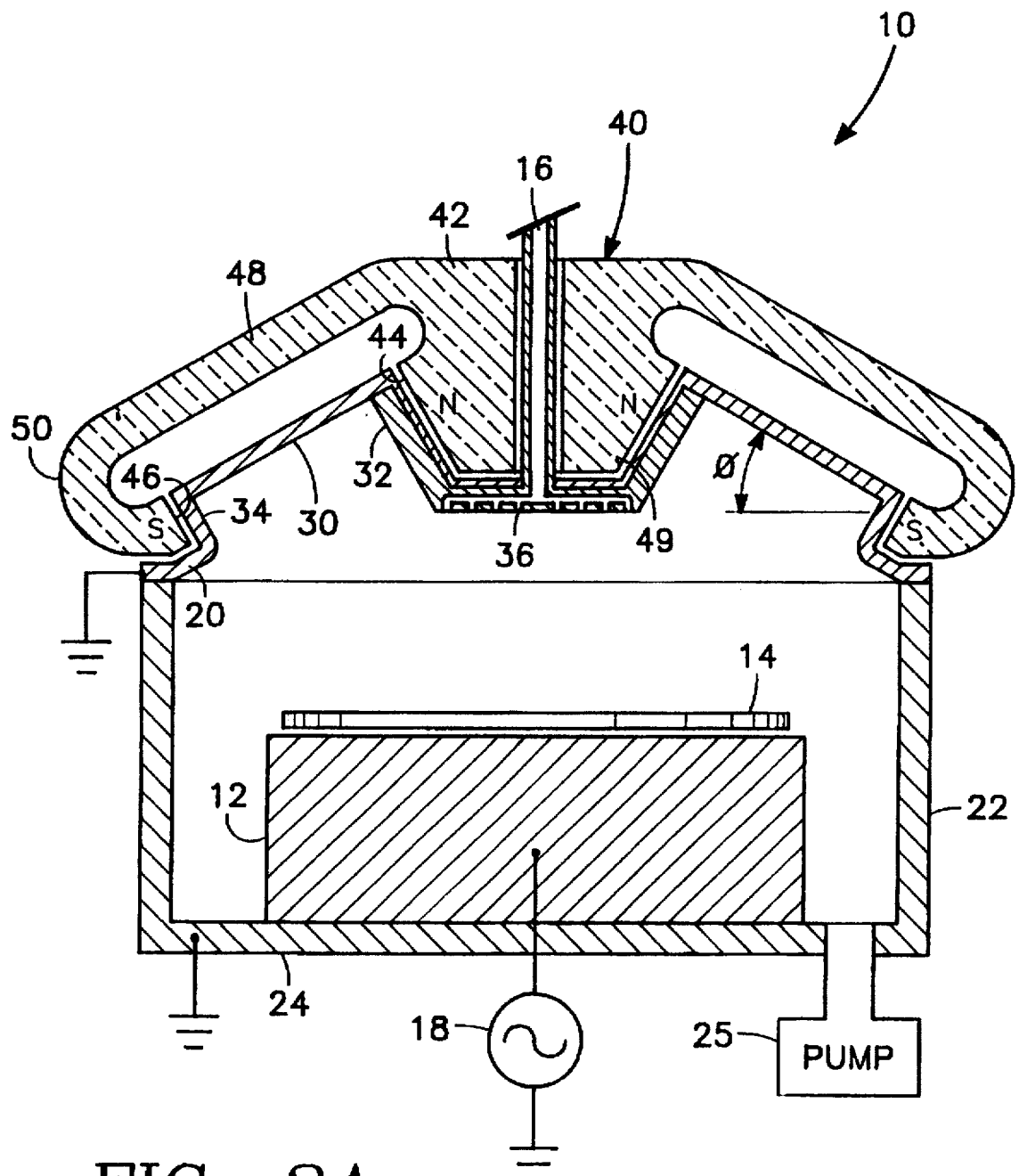
FIG. 2A is a side view of a plasma reactor of a second embodiment of the invention employing a permanent magnet in the shape of a magnetic yoke with multiple radial spokes.
Figure 2B:
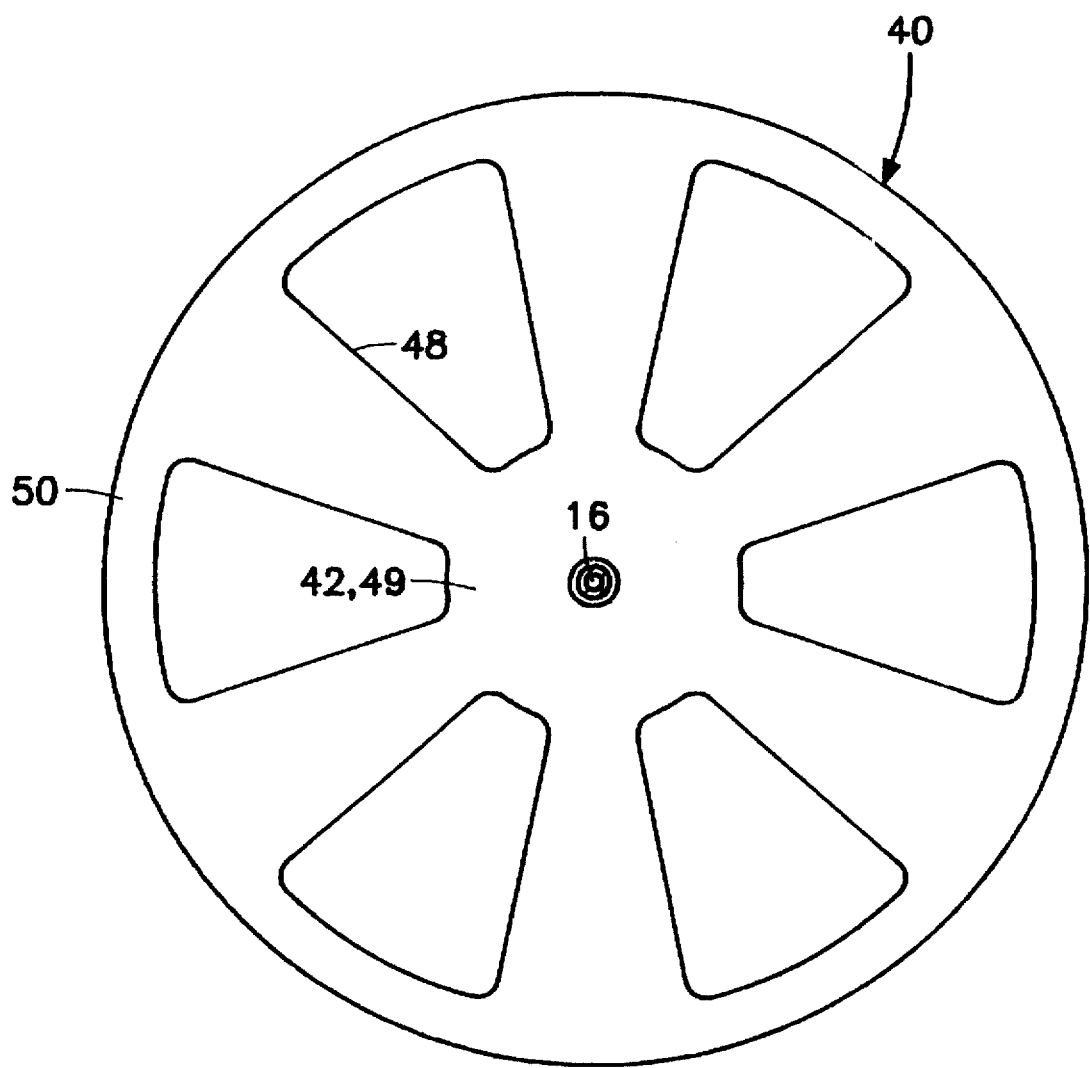
FIG. 2B is a top view corresponding to FIG. 2A.

FIGS. 2A and 2B illustrate another embodiment which enjoys the advantages of the embodiment of FIGS. 1A and 1B, but in which the spokes 48 are permanent magnets, eliminating the need for the windings 50 and the current source 52 of FIGS. 1A and 1B. As described previously herein, radial symmetry of the MERIE magnetic field reduces or eliminates magnetic field corners and ion/electron focusing at the wafer surface. The MERIE magnetic field of the embodiment of FIGS. 2A and 2B is relatively shallow (as in the embodiment of FIGS. 1A and 1B) so that the wafer is beyond the range of the MERIE magnetic field, thereby preventing any ion focusing at the wafer surface and any charge damage to devices on the wafer surface. The wafer is below the effective range of the magnet field because, as shown in the drawing of FIGS. 2A and 2B, the principal magnetic field lines of the MERIE field converge well-above the level of the wafer and wafer pedestal 12.

Figure 3A:
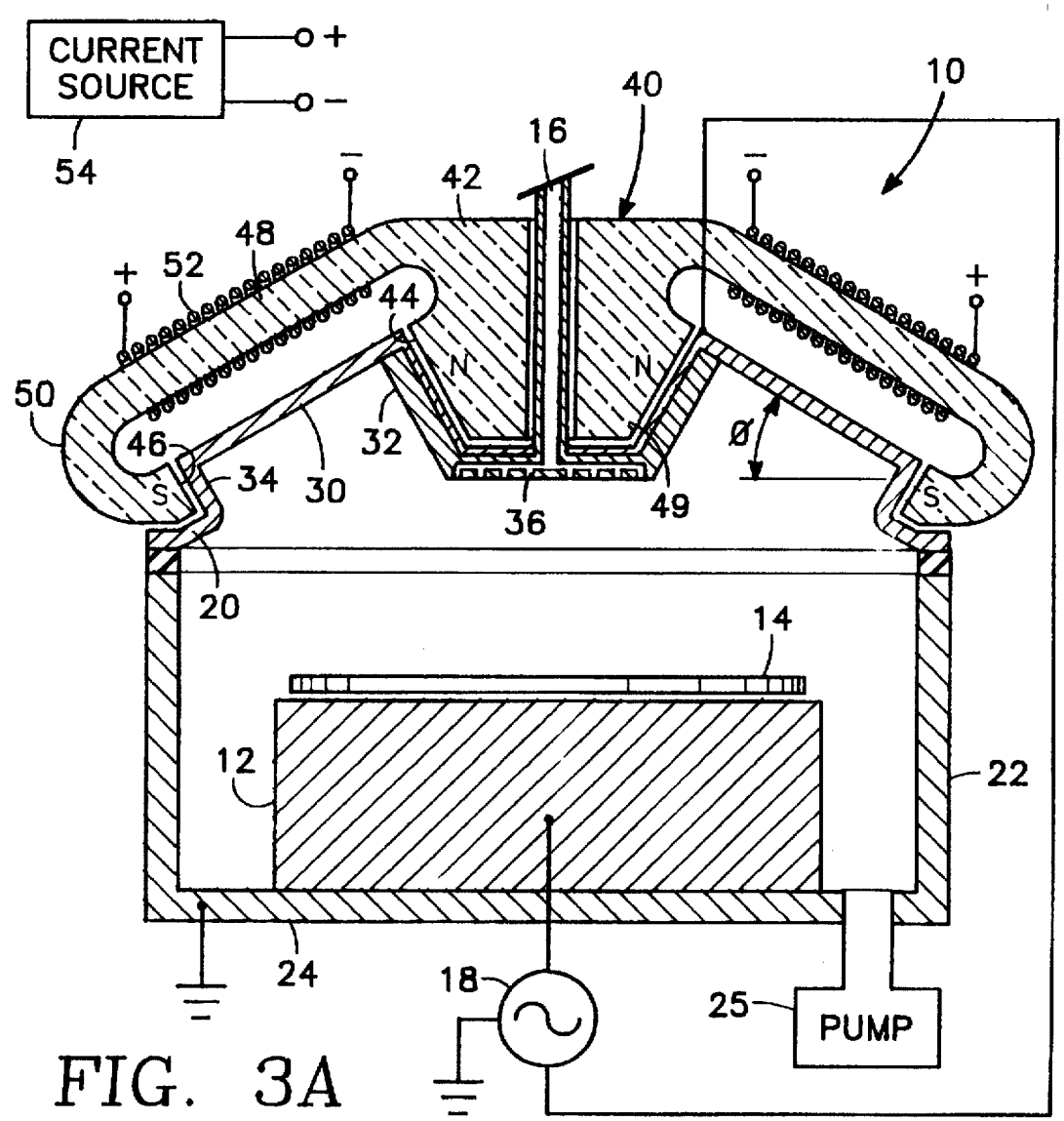
FIG. 3A is a side view of a plasma reactor similar to the embodiment of FIG. 2A in which the ceiling is replaced by a ceiling electrode.

In the embodiment of FIG. 3A, the ceiling 20 is replaced by a ceiling electrode 80 under the magnetic source 40. The ceiling electrode 80 is formed of a non-magnetic conductive material (such as polysilicon or aluminum). One way of implementing the embodiment of FIG. 3A is to connect the RF source 18 across the pedestal 12 and the ceiling electrode 80. Preferably, the ceiling electrode 80 is electrically insulated from any grounded surfaces of the chamber 10 such as the cylindrical side wall 22.

Figure 3B:
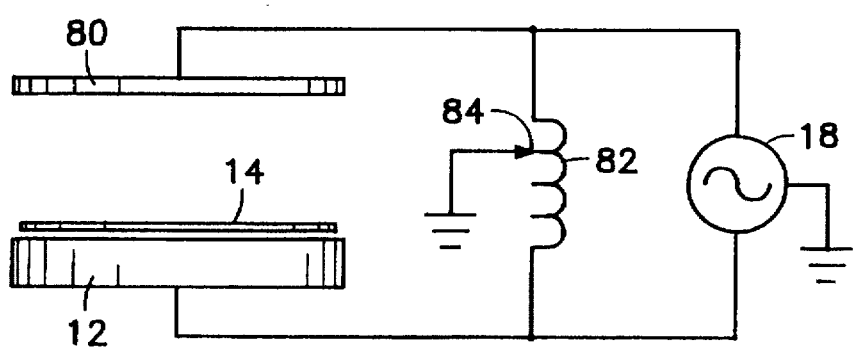
FIG. 3B is a schematic diagram of one way of implementing the embodiment of FIG. 3A.

FIG. 3B illustrates another way of implementing the embodiment of FIG. 3A using the invention disclosed in U.S. patent application Ser. No. 08/517,177 filed Aug. 21, 1995 by Hong Ching Shan et al. entitled "Broad-Band Adjustable Power Ratio Phase Inventing Plasma Reactor" (APM docket 791). In this implementation, the RF source 18 is connected across a coil inductor 82 and across the pedestal 12 and the ceiling electrode 80. The coil inductor 82 has a movable ground tap 84 whose position along the inductor 82 determines the apportionment of RF power between the pedestal 12 and the ceiling electrode 80. Preferably, the greater portion RF power is applied to the wafer pedestal 12 while a lesser portion is applied to the ceiling electrode 80. For this purpose, the ground tap 84 is positioned to contact a winding on the coil inductor 82 closer to the connection to the ceiling electrode 80 and further from the connection to the wafer pedestal 12.

Figure 4:
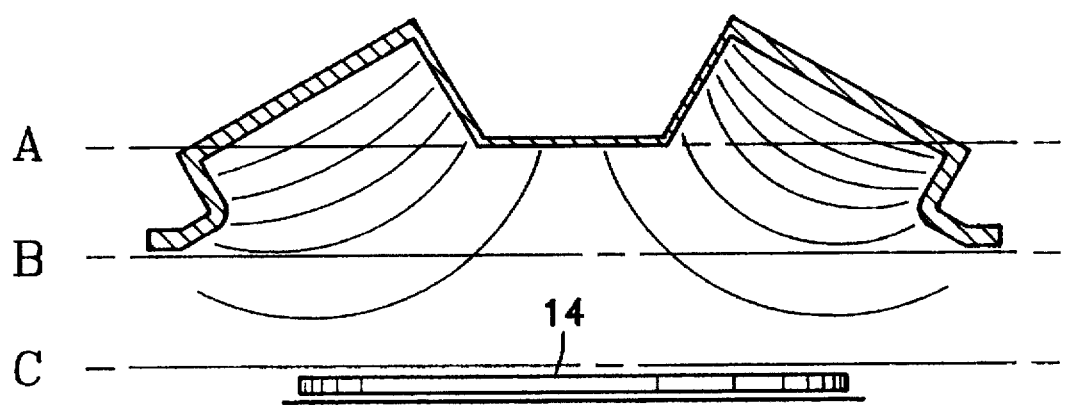
FIG. 4 is a side view illustrating the magnetic field lines in the chamber of FIG. 1A.
Figure 5A:
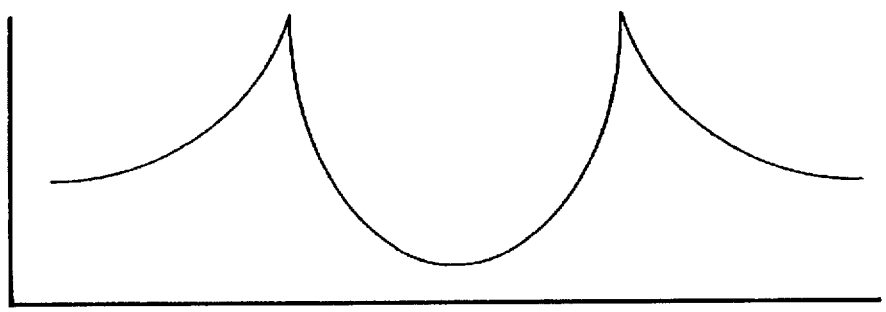
FIGS. 5A, 5B and 5C are graphs depicting the radial distribution of the plasma ion density at respective horizontal planes below the ceiling.
Figure 5B:
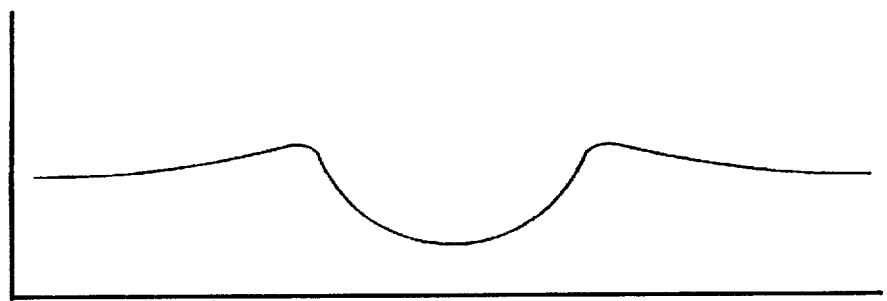
Figure 5C:
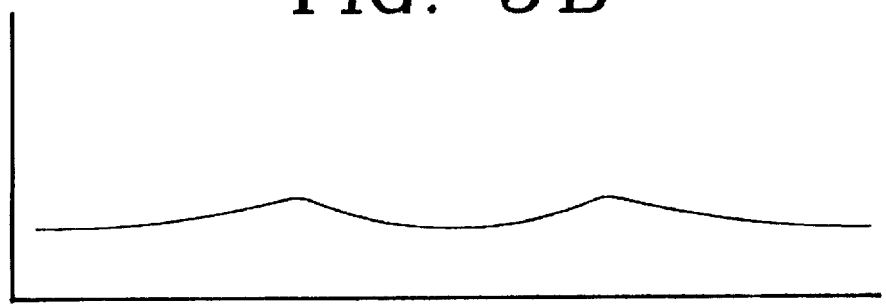

FIG. 4 is a side view of the chamber of FIG. 1A illustrating the field lines of the MERIE magnetic field. FIGS. 5A, 5B and 5C are respective graphs illustrating plasma ion density as a function of radial distance from the center of the chamber at three different horizontal planes below the ceiling 20 (corresponding to planes A, B and C, respectively, of FIG. 4). The plasma ion density at a particular radial position is a function of the strength of the MERIE magnetic field at that same radial position because the enhanced production of ions is affected by the MERIE field strength. Nearest the ceiling, the magnetic field—and therefore the plasma ion density distribution of curve A—decreases with increasing radius because the distance between windings on the radial spokes 48 increases with radius. The magnetic field—and therefore the plasma ion density—reaches a maximum near the inner circumferential surface of the yoke 40 and then suddenly falls off rapidly at the center. The increase in plasma ion density can be compensated by forming the annular pocket 30 in a conical shape with the tilt angle Θ preferably adjusted to provide the optimum compensation. This minimizes the radial fluctuations in magnetic field strength. The radial fluctuations in plasma ion density fade with distance from the ceiling (FIG. 5B) due to ion diffusion so that, ideally, near the wafer surface (FIG. 5C) the fluctuations have nearly disappeared. To achieve this optimum condition, the tilt angle Θ is adjusted by the skilled worker using trial and error during the design phase of a particular reactor until the desired condition is obtained. Preferably, the tilt angle Θ is in the range of 15 to 45 degrees.

While the invention has been described in detail by specific reference to preferred embodiments, it is understood that variations and modifications thereof may be made without departing from the true spirit and scope of the invention.

What is claimed is:

1. A plasma reactor for processing a workpiece, comprising:
   a reactor chamber including a ceiling having an annular pocket bounded by inner and outer circumferential side walls;
   a pedestal for supporting said workpiece within said chamber under said ceiling;
   a processing gas supply inlet into said chamber;
   an RF plasma power source coupled to said pedestal; and
   a magnetic field source outside said chamber and near said ceiling providing a radially symmetrical magnetic field relative to an axis of symmetry of said chamber within said annular pocket, said radially symmetrical magnetic field having a magnetic pole of one type facing said inner circumferential wall and a magnetic pole of the opposite type facing said outer circumferential wall so as to apply a magnetic field generally straight across said annular pocket.

2. The reactor of claim 1 wherein said annular pocket has a conical cross section with a tilt angle toward an upwardly apex.

3. The reactor of claim 2 wherein said tilt angle corresponds to an optimum magnetic field uniformity along a horizontal plane of said chamber.

4. The reactor of claim 1 wherein said magnetic field source comprises a magnetic yoke comprising plural radial spokes overlying said ceiling and placed symmetrically with respect to the axis of symmetry of said annular pocket, and inner and outer circumferential yoke faces facing said inner and outer circumferential side walls, respectively, of said annular pocket, each of said radial spokes comprising a pair of ends connected respectively to said inner and outer circumferential yoke surfaces.

5. The reactor of claim 4 further comprising electromagnetic windings around each of said radial spokes and a current source connected to furnish current through said windings.

6. The reactor of claim 4 wherein said radial spokes comprise permanent magnets.

7. The reactor of claim 1 wherein said radially symmetrical magnetic field penetrates from said ceiling into said chamber to a shallow depth, and wherein the height of said ceiling above said workpiece exceeds said depth.

8. The reactor of claim 1 wherein said electrical current source furnishes one of: (a) a D.C. current, (b) an A.C. current and (c) an RF current.

9. The reactor of claim 1 wherein said ceiling comprises a ceiling electrode, said RF power source being connected across said pedestal and said ceiling electrode.

10. The reactor of claim 9 further comprising a circuit for apportioning power from said RF power source between said pedestal and said ceiling electrode.

11. The reactor of claim 10 wherein said circuit comprises a coil inductor connected across said RF power source and a movable ground tap connecting a selected winding of said coil inductor to ground.

12. The reactor of claim 1 further comprising a shower head processing gas inlet in a portion of said ceiling encircled by said inner circumferential side wall.

13. A plasma reactor for processing a workpiece, comprising:
   a reactor chamber including a ceiling having an annular pocket bounded by inner and outer circumferential side walls;
   a pedestal for supporting said workpiece within said chamber under said ceiling;
   a processing gas supply inlet into said chamber;
   an RF plasma power source coupled to said pedestal; and
   a magnetic field source outside said chamber and near said ceiling comprising a magnetic pole of one type facing said inner circumferential wall and a magnetic pole of the opposite type facing said outer circumferential wall so as to apply a magnetic field generally straight across said annular pocket.

14. The reactor of claim 13 wherein said annular pocket has a conical cross section with a tilt angle toward an upwardly apex.

15. The reactor of claim 14 wherein said tilt angle corresponds to an optimum magnetic field uniformity along a horizontal plane of said chamber.

16. The reactor of claim 13 wherein said magnetic field source comprises a magnetic yoke comprising plural radial spokes overlying said ceiling and placed symmetrically with respect to the axis of symmetry of said annular pocket, and inner and outer circumferential yoke faces facing said inner and outer circumferential side walls, respectively, of said annular pocket, each of said radial spokes comprising a pair of ends connected respectively to said inner and outer circumferential yoke surfaces.

17. The reactor of claim 16 further comprising electromagnetic windings around each of said radial spokes and a current source connected to furnish current through said windings.

18. The reactor of claim 16 wherein said radial spokes comprise permanent magnets.

19. The reactor of claim 13 wherein said radially symmetrical magnetic field penetrates from said ceiling into said chamber to a shallow depth, and wherein the height of said ceiling above said workpiece exceeds said depth.

20. The reactor of claim 17 wherein said electrical current source furnishes one of: (a) a D.C. current, (b) an A.C. current and (c) an RF current.

21. The reactor of claim 13 wherein said ceiling comprises a ceiling electrode, said RF power source being connected across said pedestal and said ceiling electrode.

22. The reactor of claim 21 further comprising a circuit for apportioning power from said RF power source between said pedestal and said ceiling electrode.

23. The reactor of claim 22 wherein said circuit comprises a coil inductor connected across said RF power source and a movable ground tap connecting a selected winding of said coil inductor to ground.

24. The reactor of claim 13 further comprising a shower head processing gas inlet in a portion of said ceiling encircled by said inner circumferential side wall.

* * * * *